May 6, 1969 M. P. LEPSELTER 3,442,701
METHOD OF FABRICATING SEMICONDUCTOR CONTACTS
Filed May 19, 1965

INVENTOR
M. P. LEPSELTER
BY H. W. Lockhart
ATTORNEY 3,442,701
METHOD OF FABRICATING SEMICONDUCTOR CONTACTS Martin P. Lepselter, New Providence, N.J., assignor to Bell Telephone Laboratories, Incorporated, New York, N.Y., a corporation of New York Filed May 19, 1965, Ser. No. 457,056
Int. Cl. B44d *1/18;* C23c *15/00*
U.S. Cl. 117—212 5 Claims

ABSTRACT OF THE DISCLOSURE

A method of fabricating electrodes on a semiconductor device in order to avoid the unsatisfactory technique of chemical etching. A silicon oxide mask is deposited on the surface of a semiconductor body, the mask conforming to the desired electrode geometry. A first layer of refractory metal from the group consisting of titanium, zirconium, vanadium and hafnium is deposited over the masked and unmasked portions of the semiconductor body and a second layer of platinum, nickel or gold is deposited over the first metal layer. Portions of the second metal are removed by a back-sputtering technique to conform to the electrode geometry defined by the silicon oxide mask. Then, the refractory metal is converted to an insulating oxide by low temperature heat treatment when exposed to oxygen.

This relates to the fabrication of electronic solid state devices having closely spaced metal film electrodes, and particularly, planar semiconductor devices having multiple metal layers comprising such electrodes.

During the fabrication of solid state devices, for example, high frequency transistors, deposited metal film electrodes are formed by precise masking and chemical etching procedures. These techniques have limitations from the standpoint of the precision with which the electrodes can be defined. In particular, chemical etching may result in undesired undercutting of masked metal areas, or the etchant may fail to penetrate adequately into all of the unmasked portions designed for removal particularly where dimensions are of the order of microns. Moreover, there is a general desire to avoid wet chemical operations in the latter stages of device fabrication because of the tendency of such techniques to increase the contamination level.

Accordingly, an object of this invention is to improve and simplify semiconductor device fabrication.

In particular, an object is to facilitate the making of very closely spaced metal electrodes on solid state devices.

In one aspect this invention stems from the structural arrangements disclosed in my copending application, Ser. No. 331,168, filed Dec. 17, 1963, and now United States Patent No. 3,287,612. In that application there is disclosed a semiconductor device having multiple metal layers, typically titanium, platinum and gold, for the formation of the metal electrodes. In accordance with that disclosure, the electrodes are fabricated using as a final step the chemical etching of the undermost metal layer to define the configuration of the metal electrodes. In accordance with this invention, instead of the chemical etching step to remove the undermost, specifically titanium, portions, a simple oxidation heat treatment is used to transform the exposed portions of titanium to titanium oxide, which is a dielectric. It has been found that only those portions of titanium which are not covered by an overlying layer of another metal, such as platinum or gold, will convert to the oxide. Thus, this treatment avoids the use of a chemical etching and offers a high degree of precision. Specifically, at the present time, the process is capable of delineating electrode areas at least within the capabilities of the optical masking art.

In addition to the metal titanium specifically mentioned above, other so-called active refractory metals of the same general class, including particularly zirconium, hafnium and vanadium, may be used with generally similar processing and results. Moreover, although, in my copending application referred to above, the portion converted from a metal to an oxide by heat treatment overlies a silicon oxide dielectric layer, for certain device applications it may also directly contact the semiconductor or other substrate surfaces.

The invention and its other objects and features will be understood with greater clarity from the following detailed description taken in conjunction with the drawings in which.

Figure 1:
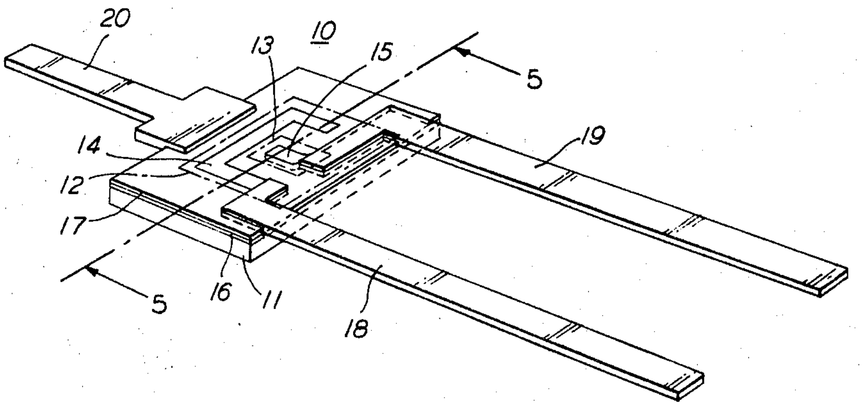
FIG. 1 is a perspective view of a beam-lead transistor illustrating spaced metal electrodes on the surface of a planar device.

The device 10 of FIG. 1 is a beam-lead transistor of the linear type referred to in my copending application noted above. The device 10 comprises a silicon wafer 11 having a diffused base zone defined by the broken line 12 and a successively diffused emitter zone defined by the broken line 13. As will be explained more fully hereinafter, the upper surface of the silicon wafer 11 is covered by oxide dielectric layers 16 and 17. Low resistance contact is made to the base zone by the deposited metal electrode 14 and to the emitter zone by the deposited metal electrode 15. The beam-lead members 18 and 19 connect to the base and emitter electrodes 14 and 15, respectively. Low resistance contact to the collector region is made by means of the beam-lead member 20.

Figure 2:
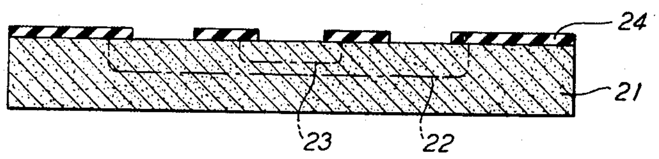
FIGS. 2, 3, 4 and 5, show, in a section taken through the device of FIG. 1, the arrangement of the device at significant steps in the process in accordance with this invention.

FIG. 2 shows a section through the silicon wafer at an initial stage of fabrication. At this point the wafer 21 has a diffused base zone defined by the broken line 22 and a diffused emitter zone defined by the broken line 23. A layer of silicon oxide 24 has been formed on the active surface of the wafer 21 and areas have been exposed for making the low resistance contacts to the base and emitter zones.

Figure 3:
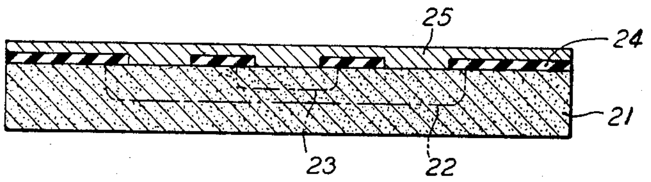

In the view shown in FIG. 3, a first metal layer 25, of zirconium, is deposited over the entire oxide masked surface. Thus, the zirconium contacts the emitter and base zone surfaces over limited areas not covered by silicon oxide.

Figure 4:
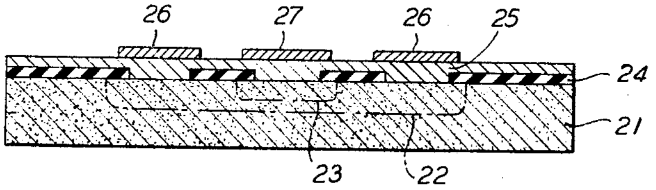

In FIG. 4, overlying metal patterns correspond to the electrode configurations 14 and 15 of FIG. 1 formed as represented by the contacts 26 and 27, respectively. Thus, the two separated contacts designated 26 represent the arms of the base electrode 14 and contact 27 the centrally disposed emitter electrode 15.

In one method for forming these overlying metal contacts 26 and 27, a layer of platinum is deposited over the entire surface of the first metal layer 25 of zirconium. A photoresist mask then is formed on the platinum surface in accordance with the desired electrode pattern. Then, using the back-sputtering technique as disclosed in my copending application Ser. No. 347,173, filed Feb. 25, 1964, and now United States Patent No. 3,271,286, the platinum layer not covered by photoresist is removed.

In the back-sputtering technique, a form of cathodic sputtering, the surface of the semiconductor workpiece is subjected to high energy ionic bombardment without applying a high electric field directly across the semiconductor member. More specifically, in cathodic sputtering apparatus, the semiconductor is placed in physical contact with an insulating layer which, in turn, contacts a cathode member. In operation, a glow discharge is produced in the vicinity of the semiconductor surface, and as a result, high energy ions impact the surface with consequent removal of material therefrom. Inasmuch as different materials have different rates of removal, a given material may be selectively depleted from the surface in this manner.

By back-sputtering in an ambient containing a mixture of argon and oxygen, the sputtering process can be made substantially self-terminating, i.e., as portions of the platinum layer are removed, the underlying zirconium reacts with oxygen in the ambient to produce zirconium oxide. This zirconium oxide is highly resistant to sputtering and the reaction effectively terminates.

In an alternative procedure, a continuous layer of nickel is deposited, instead of platinum, over the initial zirconium layer. The electrode pattern is then defined by depositing gold, either through a metal mask or using a photoresist mask. The exposed nickel layers then are etched to expose the zirconium layer. A typical etchant for this purpose is nitric acid which does not attack, substantially, the zirconium.

Next, in accordance with this invention, the structure illustrated in FIG. 4 is subjected to heat treatment in an oxidizing atmosphere for a sufficient period of time to convert all of the zirconium layer 25 which is not covered by the overlying metal portions 26 and 27 to the metallic oxide form. Typically, for zirconium, such heat treatment may be achieved at a temperature of 400° C. in air for a period of about six hours to convert about 1000 Angstroms of metal thickness to the oxide form. The reaction is not linear inasmuch as about 24 hours at 400° C. is required to convert 2000 Angstroms.

Figure 5:
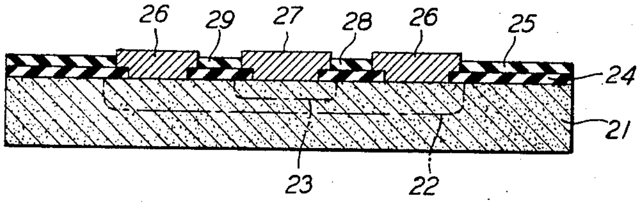

The structural arrangement of the device following this treatment is shown in FIG. 5 in which the exposed portions of the zirconium layer 25 have been converted to the dielectric, zirconium oxide. In particular, the portions 28 and 29 between the metal electrodes are now similar in electrical characteristics to the underlying silicon oxide layer 24 and afford a complete electrical separation. This technique has been utilized for contact separations of the order of microns and apparently the process is limited only by the present limitations of the optical techniques used to produce the masks.

Although the invention has been described in terms of certain specific embodiments, it will be understood that these are merely illustrative and other arrangements may be devised by those skilled in the art which are within the spirit and scope of this invention.

In particular, various combinations of metals may be used for the overlying layers, it being required only that they protect the underlying layer and not oxidize substantially at the temperatures required for treatment of the underlying layer.

What is claimed is:

1. The method of fabricating a semiconductor device comprising the steps of forming on a surface of a semiconductor body a silicon oxide mask such that the unmasked portions of the semiconductor body conform to the electrode pattern of the device, depositing a first layer comprising a substantially uniform coating of a first metal over both the silicon oxide and the unmasked portions of the semiconductor body, said first metal selected from the group consisting of titanium, zirconium, vanadium, and hafnium, depositing a layer of a second metal selected from the group consisting of platinum, nickel, and gold on top of said first layer, removing portions of said second layer such that all remaining portions of said second metal conform to the same pattern formed by the silicon oxide mask, and heating said device at an elevated temperature in air for a period sufficient to convert all those portions of said first metal layer not covered by the second metal layer to an oxide of the metal of said first layer.

2. The method of fabricating a semiconductor device comprising the steps of forming on the surface of a semiconductor body a silicon oxide mask such that the unmasked portions of said semiconductor body conform to the electrode pattern of the device, depositing a first layer comprising a substantially uniform coating of zirconium over both the silicon oxide and the unmasked portions of the semiconductor body, depositing on said first layer a second layer of platinum, forming on said second layer a photoresist mask such that the unmasked portions of the second layer conform to the same pattern formed by the silicon oxide mask, subjecting said masked platinum surface to cathodic sputtering in the presence of oxygen, thereby removing the unmasked portions of platinum, and heating said device at an elevated temperature of about 400 degrees centigrade for a time sufficient to convert all of said zirconium not covered by platinum to zirconium oxide.

3. The method of fabricating a semiconductor device having electrodes on the surface thereof comprising the steps of forming a silicon oxide mask on a surface of a semiconductor body such that the pattern formed by the unmasked portions of said semiconductor body conforms substantially to at least a portion of the desired electrode geometry of the device, depositing a first layer comprising a substantially uniform coating of a first metal over both the masked and the unmasked portions of the semiconductor body, said first metal selected from the group consisting of titanium, zirconium, vanadium, and hafnium, depositing a second layer of a second metal on top of said first layer, said second metal being such that it protects the first layer and does not oxidize substantially during subsequent treatment of the first layer, removing portions of said second layer such that all remaining portions of said second metal conform to the same pattern formed by the silicon oxide mask, and converting all those portions of said first metal not under said remaining portions of the second metal to an oxide of said first metal.

4. The method of claim 3 wherein the semiconductor body is silicon.

5. The method of claim 4 in which the first metal is zirconium and the second metal is platinum.

References Cited

UNITED STATES PATENTS

| | | | |
|---|---|---|---|
| 2,973,466 | 2/1961 | Atalla et al. | 317—234 |
| 3,106,489 | 10/1963 | Lepselter | 117—212 X |
| 3,169,892 | 2/1965 | Lemelson | 29—578 |
| 3,221,199 | 11/1965 | Yanagisawa | 148—6.3 X |
| 3,231,421 | 1/1966 | Schmidt | 117—212 |
| 3,237,271 | 3/1966 | Arnold et al. | 29—578 X |

ALFRED L. LEAVITT, *Primary Examiner.*

C. K. WEIFFENBACH, *Assistant Examiner.*

U.S. Cl. X.R.

117—62, 217, 221, 227; 148—6.3; 204—192